(12) United States Patent
Fujisato et al.

(10) Patent No.: US 10,340,176 B2
(45) Date of Patent: Jul. 2, 2019

(54) SUBSTRATE MOUNTING METHOD AND SUBSTRATE MOUNTING DEVICE

(71) Applicant: TOKYO ELECTRON LIMITED, Tokyo (JP)

(72) Inventors: Toshiaki Fujisato, Nirasaki (JP); Hiroaki Ashizawa, Nirasaki (JP); Taichi Monden, Nirasaki (JP); Yasushi Fujii, Nirasaki (JP); Yu Nunoshige, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/660,622

(22) Filed: Jul. 26, 2017

(65) Prior Publication Data
US 2018/0040503 A1 Feb. 8, 2018

(30) Foreign Application Priority Data
Aug. 5, 2016 (JP) .................................. 2016-154382

(51) Int. Cl.
*H01L 21/68* (2006.01)
*H01L 21/687* (2006.01)
*H01L 21/677* (2006.01)

(52) U.S. Cl.
CPC .. *H01L 21/68742* (2013.01); *H01L 21/67748* (2013.01); *H01L 21/6875* (2013.01); *H01L 21/68714* (2013.01); *H01L 21/68735* (2013.01); *H01L 21/68764* (2013.01)

(58) Field of Classification Search
CPC ........... H01L 21/6875; H01L 21/68764; H01L 21/68742
See application file for complete search history.

(56) References Cited

U.S. PATENT DOCUMENTS

| 2010/0017015 A1* | 1/2010 | Morii .................... G02F 1/1303 700/213 |
| 2014/0241836 A1* | 8/2014 | Kondoh ............ H01L 21/67259 414/226.05 |
| 2015/0267294 A1* | 9/2015 | Itatani ................. C23C 16/4412 438/758 |

(Continued)

FOREIGN PATENT DOCUMENTS

| JP | 2000-260851 A | 9/2000 |
| KR | 1020080114151 A | 12/2008 |
| KR | 1020160078399 A | 7/2016 |

*Primary Examiner* — Thomas Randazzo
(74) *Attorney, Agent, or Firm* — Nath, Goldberg & Meyer; Jerald L. Meyer

(57) ABSTRACT

There is provided a substrate mounting method of bringing a substrate close to a mounting table to mount the substrate on the mounting table by reducing a protrusion amount of a plurality of projections configured to protrude from a substrate-mounting surface of the mounting table and to support the substrate, the protrusion amount being defined to protrude from the substrate-mounting surface. The method includes: after at least a portion of the substrate is brought into contact with the substrate-mounting surface, halting an operation of bringing the substrate close to the mounting table; and after the halting the operation of bringing the substrate close to the mounting table, resuming the operation of bringing the substrate close to the mounting table.

8 Claims, 7 Drawing Sheets

(56) References Cited

U.S. PATENT DOCUMENTS

2016/0090651 A1* 3/2016 Ashihara ................. C23C 16/52
                                                         118/712
2016/0240406 A1* 8/2016 Kajihara ........... H01L 21/67109
2016/0293500 A1* 10/2016 Ohashi .................... H01L 22/20
2016/0376699 A1* 12/2016 Sasaki ............... H01J 37/32449
                                                         118/697

* cited by examiner

SUBSTRATE MOUNTING METHOD AND SUBSTRATE MOUNTING DEVICE

CROSS-REFERENCE TO RELATED APPLICATION

This application is based upon and claims the benefit of priority from Japanese Patent Application No. 2016-154382, filed on Aug. 5, 2016, the entire contents of which are incorporated herein by reference.

TECHNICAL FIELD

The present disclosure relates to a substrate mounting method of mounting a substrate on a mounting table, and a substrate mounting device.

BACKGROUND

There has been known a substrate processing apparatus in which a semiconductor wafer (hereinafter, simply referred to as "wafer") as a substrate is accommodated in a chamber and desired processes such as a film-forming process or a plasma process is performed with respect to the wafer using a process gas introduced into the chamber or plasma generated inside the chamber. In such a substrate processing apparatus, in order to perform the desired processed on the wafer, the wafer is mounted on a susceptor as a stage disposed inside the chamber.

It is necessary to mount the wafer at a predetermined position on a wafer-mounting surface (hereinafter, simply referred to as "mounting surface") of the susceptor. There may be a case where the wafer thus mounted is misaligned from the predetermined position on the mounting surface. In this case, for example, when a thermal CVD (chemical vapor deposition) process or ALD (atomic layer deposition) process as the film-forming process is performed on the wafer, the wafer is misaligned from a heater incorporated in the susceptor so that the heater fails to uniformly heat the wafer, thereby causing the thickness of a film formed on the wafer to be non-uniform. Furthermore, for example, when an etching process as the plasma process is performed on the wafer, an impedance deviation caused by the misalignment of the wafer occurs at an edge portion of the wafer. This makes the thickness of a sheath formed on a surface of the wafer non-uniform, which makes the etched amount in each portion of the wafer non-uniform.

To address this, there has been proposed a technique in which a pocket composed of a recess having a diameter slightly larger than that of the wafer is installed in the mounting surface, and projections for positioning the wafer are formed at a side surface of the pocket. When the wafer is received in the pocket, the wafer descends along a tapered surface formed in each of the projections so that the wafer is received at a proper position inside the pocket.

In general, however, when a wafer is mounted on a susceptor, the wafer is first delivered from a transfer arm to a plurality of lift pins formed to protrude upwardly from a mounting surface of the susceptor. The transfer arm is withdrawn from a chamber, and subsequently, the lift pins descend or the susceptor ascends to mount the wafer on the susceptor.

However, when the wafer is mounted on the susceptor, there may be a case where the wafer does not come into an uniform contact with the mounting surface and only a portion thereof is in contact with the mounting surface. In this case, there is a problem that even if the pocket is formed in the mounting surface, a drag force generated from the mounting surface is exerted on the wafer at a slight angle with respect to a vertical direction of the wafer and a component of the drag force in a direction parallel to the wafer is exerted on the wafer as a moving force so that the wafer may be misaligned from the predetermined position on the mounting surface of the susceptor. In particular, if the wafer has a larger diameter, an increase in a contact area between the wafer and the mounting surface also involves an increase in the drag force and ultimately the component thereof, so that there may be concern that the misalignment of the wafer becomes remarkable.

SUMMARY

Some embodiments of the present disclosure provide a substrate mounting method and a substrate mounting device capable of suppressing the misalignment of a substrate when the substrate is mounted on a mounting table.

According to one embodiment of the present disclosure, there is provided a substrate mounting method of bringing a substrate close to a mounting table to mount the substrate on the mounting table by reducing a protrusion amount of a plurality of projections configured to protrude from a substrate-mounting surface of the mounting table and to support the substrate, the protrusion amount being defined to protrude from the substrate-mounting surface. The method includes: after at least a portion of the substrate is brought into contact with the substrate-mounting surface, halting an operation of bringing the substrate close to the mounting table; and after the halting the operation of bringing the substrate close to the mounting table, resuming the operation of bringing the substrate close to the mounting table.

According to another embodiment of the present disclosure, there is provided a substrate mounting device including: a mounting table; and a plurality of projections configured to protrude from a substrate-mounting surface of the mounting table and to support a substrate, wherein the substrate is mounted on the mounting table by ascending the mounting table toward the substrate supported by the plurality of projections, wherein an operation of ascending the mounting table is halted after at least a portion of the substrate is brought into contact with the substrate-mounting surface, and the operation of ascending the mounting table is resumed after the operation of ascending the mounting table is halted.

According to another embodiment of the present disclosure, there is provided a substrate mounting device which includes: a mounting table; and a plurality of projections configured to protrude from a substrate-mounting surface of the mounting table and to support a substrate, wherein the substrate is mounted on the mounting table by descending the plurality of projections toward the mounting table, wherein an operation of descending the plurality of projections is halted after at least a portion of the substrate is brought into contact with the substrate-mounting surface, and the operation of descending the plurality of projections is resumed after the operation of descending the plurality of projections is halted.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a substrate mounting device and a substrate mounting method according to a first embodiment of the present disclosure will be described.

Figure 1A:
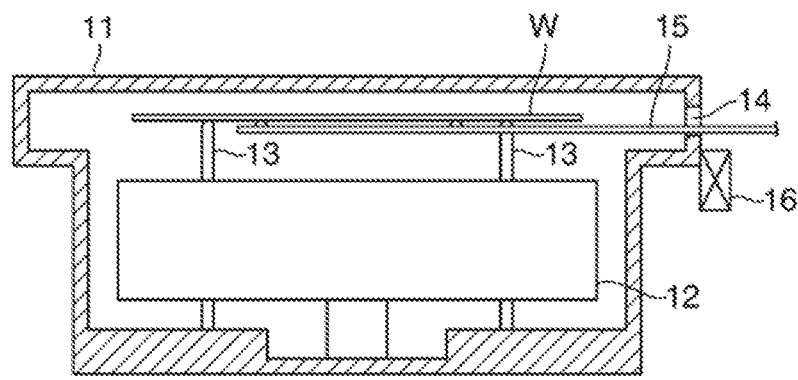
FIGS. 1A and 1B are sectional views schematically showing a configuration of a substrate processing apparatus which incorporates a substrate mounting device according to a first embodiment of the present disclosure, FIG. 1A showing a state where a wafer is delivered to lift pins and FIG. 1B showing a state where the wafer is mounted on a susceptor.
Figure 1B:
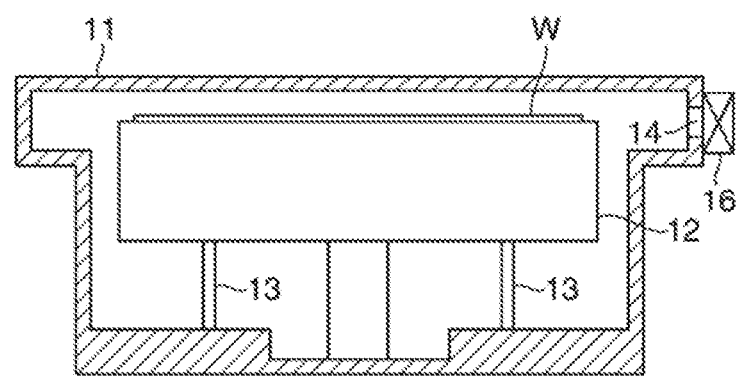

FIGS. 1A and 1B are sectional views schematically showing a configuration of a substrate processing apparatus which incorporates the substrate mounting device according to this embodiment. FIG. 1A shows a state where a wafer is delivered to lift pins, and FIG. 1B shows a state where the wafer is mounted on a susceptor.

In FIGS. 1A and 1B, the substrate processing apparatus 10 includes a housing-shaped chamber 11 for accommodating a wafer W, a table-shaped susceptor (mounting table) 12 disposed at a lower portion inside the chamber 11, and a plurality of (e.g., three) lift pins (projections) 13 (only two lift pins are shown in FIGS. 1A and 1B) formed to protrude upwardly from a wafer-mounting surface defined as an upper surface of the susceptor 12. A combination of the susceptor 12 and the plurality of lift pins 13 constitutes the substrate mounting device according to the present embodiment. A gate 14 used as opening is formed in a sidewall of the chamber 11. A transfer arm 15 configured to hold the wafer W enters the chamber 11 via the gate 14. The height of the gate 14 is substantially equal to the height of a tip of each of the plurality of lift pins 13. Thus, the wafer W held by the transfer arm 15 is located in the vicinity of the tip of each of the plurality of lift pins 13 and at an upper portion inside the chamber 11. The wafer W is delivered to the lift pins 13 by slightly descending the transfer arm 15 or slightly ascending the lift pins 13. The transfer arm 15 which has transferred the wafer W to the lift pins 13 is withdrawn from the chamber 11. Further, a gate valve 16 configured to open and close the gate 14 is installed at a side of the chamber 11. If the transfer arm 15 is withdrawn from the chamber 11, the gate valve 16 closes the gate 14.

Each of the lift pins 13 is installed upwardly from a bottom portion of the chamber 11 and passes through the susceptor 12 in a vertical direction. Each of the lift pins 13 is configured so as not to be moved, whereas the susceptor 12 is configured so as to be moved in an upward/downward direction. Once the respective lift pins 13 support the wafer W, the susceptor 12 is moved upwardly (ascends) so as to bring the wafer W thus supported close to the wafer-mounting surface of the susceptor 12 and to mount the wafer W on the wafer-mounting surface as it is. A heater and a coolant flow passage (both not shown) are built in the susceptor 12 to control a temperature of the mounted wafer W. In some embodiments, the respective lift pins 13 may be configured to be movable upwardly and downwardly.

Further, the substrate processing apparatus 10 includes a process gas introducing mechanism, an exhaust mechanism or a plasma generating mechanism (all not shown). For example, the substrate processing apparatus 10 uses these mechanisms to perform desired processes (e.g., a film-forming process and a plasma process) with respect to the wafer W using a process gas or plasma in a state in which an interior of the chamber 11 is depressurized.

Figure 2A:
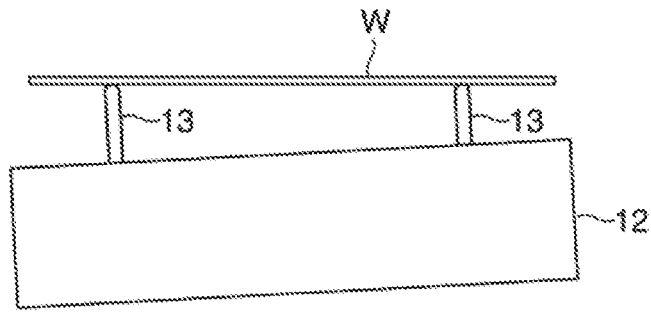
FIGS. 2A to 2C are process views for illustrating a reason why the wafer is displaced from a predetermined position on a mounting surface when the wafer is mounted on the susceptor.
Figure 2B:
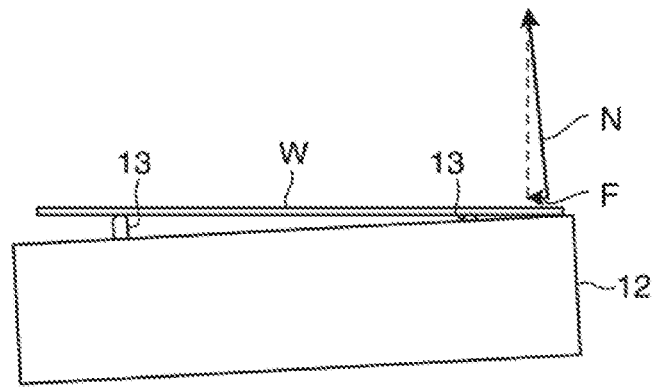

Incidentally, In the substrate processing apparatus 10, in order to stably mount the wafer W on the mounting surface of the susceptor 12, the respective lift pins 13 and the susceptor 12 are arranged to allow the mounting surface to be parallel to a virtual plane (hereinafter, referred to as "wafer-supporting plane") defined by the tips of the lift pins 13. However, due to a mechanical tolerance of each of the lift pins 13 or the susceptor 12, ultimately wobbling caused during the movement of the susceptor 12, the mounting surface and the wafer-supporting plane may not be completely parallel to each other. For example, the wafer-supporting plane may be slightly inclined with respect to the mounting surface (FIG. 2A). In this case, when the susceptor 12 ascends to bring the wafer W closer to the mounting surface, namely when the susceptor 12 performs an approaching operation, the entire surface of the wafer W does not come into contact with the mounting surface and a portion of the wafer W, for example, an edge of the wafer W, primarily comes into contact with the mounting surface (FIG. 2B). At this time, a drag force N caused by the contact is exerted on the edge of the wafer W. The drag force N is exerted perpendicularly to the mounting surface. Meanwhile, as described above, since the wafer-supporting plane is slightly inclined with respect to the mounting surface, the wafer W is also inclined with respect to the mounting surface. Therefore, the drag force N is not exerted perpendicularly to the wafer W but is exerted at a slight angle with respect to the vertical direction of the wafer W. Thus, a component F of the drag force N is horizontally exerted on the wafer W as a movement force so that the wafer W may be shifted in the horizontal direction.

Figure 2C:
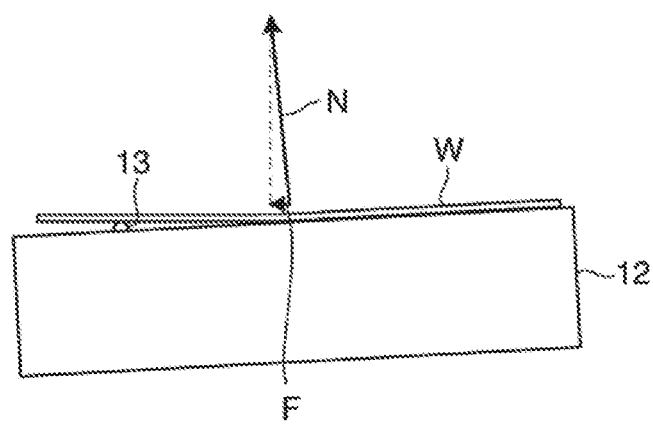

Furthermore, as the susceptor 12 continuously ascends, the contact between the mounting surface and the wafer W progresses. During that time, the drag force N is continuously exerted on the wafer W with such a progress of the contact. Thus, the component F of the drag force is continuously exerted on the wafer W as the moving force in the horizontal direction (FIG. 2C). If the progress of the contact between the wafer W and the mounting surface is continued without interruption, gases, for example, a process gas or dilution gas may remain between the wafer W and the mounting surface. In this case, particularly, if the interior of the chamber 11 is depressurized to perform a desired process on the wafer W, a difference in pressure between the interior of the chamber 11 and a gap between the wafer W and the mounting surface is increased, whereby the wafer W floats from the mounting surface and thus is likely to be shifted. This further encourages the horizontal misalignment of the wafer W, which is caused by the aforementioned moving force. As a result, the wafer W may be largely shifted in the horizontal direction, resulting in a case where the wafer W is misaligned from a predetermined position on the mounting surface.

The present embodiment is to prevent the component F from being exerted on the wafer W when the susceptor 12 ascends.

Figure 3A:
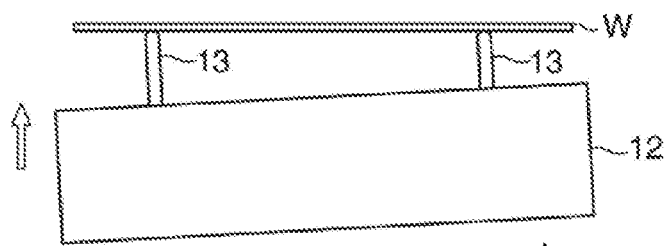
FIGS. 3A to 3E are process views showing a substrate mounting method according to the present embodiment.
Figure 3B:
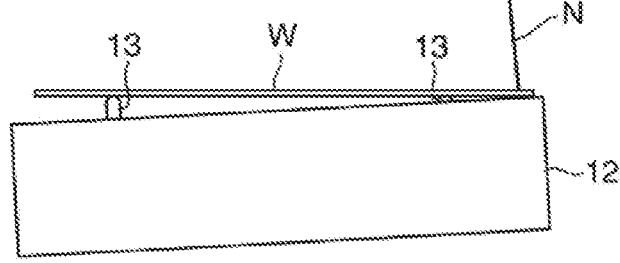
Figure 3C:
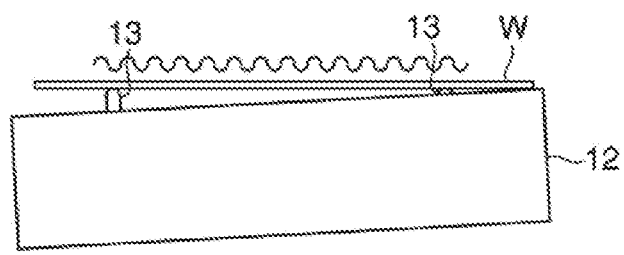
Figure 3D:
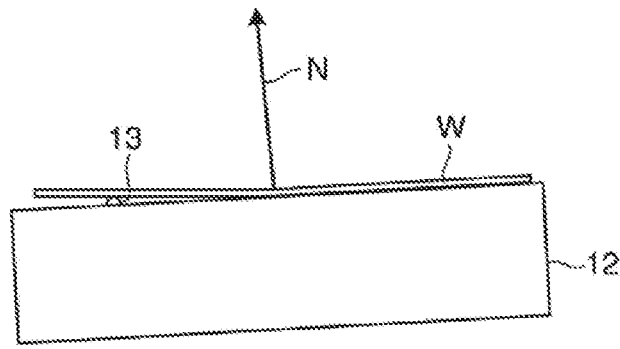
Figure 3E:
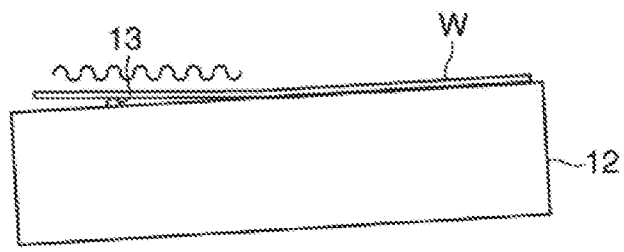
Figure 4:
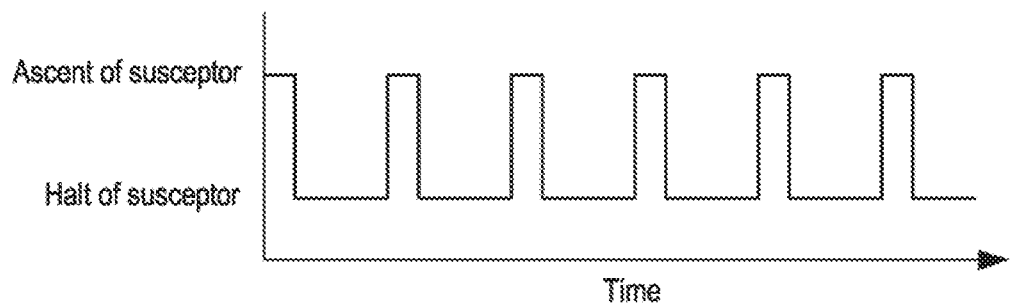
FIG. 4 is a sequence diagram of the substrate mounting method of FIGS. 3A to 3E.

FIGS. 3A to 3E are process views showing a substrate mounting method according to the present embodiment, and FIG. 4 is a sequence diagram of the substrate mounting method of FIGS. 3A to 3E.

First, the wafer W is delivered to the respective lift pins 13 and the respective lift pins 13 supports the wafer W. Then, the susceptor 12 ascends until the edge of the wafer W is brought into contact with the mounting surface (FIG. 3A). When the edge of the wafer W is brought into contact with the mounting surface, the drag force N caused from the mounting surface is exerted on the wafer W (FIG. 3B). Usually, if an external force is applied to a plate-shaped object, the plate-shape object vibrates. That is to say, the external force is converted into the vibration in the plate-shaped object. In this embodiment, the drag force N exerted on the wafer W is converted into the vibration in the wafer W (FIG. 3C). Meanwhile, in this embodiment, once the edge of the wafer W is brought into contact with the mounting surface, the ascent operation of the susceptor 12 is halted. In general, if the plate-shaped object remains in a continuous stationary state, the vibration of the plate-shaped object is attenuated by a damping effect of the plate-shape object. Once the ascent operation of the susceptor 12 is halted, the progress of the contact between the wafer W and the mounting surface is interrupted halfway. As a result, the wafer W remains stationary. In this embodiment, the halt of the ascent operation of the susceptor 12 continues for a predetermined time, e.g., 0.5 seconds. In other words, since the wafer W continuously remains stationary for the predetermined time, the vibration of the wafer W into which the drag force N has been converted is attenuated by the damping effect of the wafer W. Therefore, in this embodiment, the drag force N caused by the contact between the edge of the wafer W and the mounting surface is converted into the vibration of the wafer W, and subsequently, the vibration is attenuated, ultimately extinguished.

Subsequently, after the halt of the ascent operation of the susceptor 12 continues for the predetermined time, the ascent operation of the susceptor 12 is resumed. If the susceptor 12 ascends by a certain level, for example, about 0.1 mm, the ascent operation is halted again for the predetermined time. At this time, the drag force N is exerted on the wafer W as the contact between the wafer W and the mounting surface proceeds (FIG. 3D). The drag force N exerted on the wafer W is converted into the vibration of the wafer W (FIG. 3E). Even in this situation, the wafer W remains in a continuous stationary state for the predetermined time, whereby the vibration of the wafer W into which the drag force N has been converted is attenuated by the damping effect of the wafer W. Therefore, in this embodiment, the drag force N caused by the progress of the contact between the wafer W and the mounting surface is converted into the vibration of the wafer W, and subsequently, the vibration is attenuated, ultimately extinguished.

Thereafter, the halt of the ascent operation of the susceptor 12 for the predetermined time and the resumption of the ascent operation of the susceptor 12 are repeated until the contact between the wafer W and the mounting surface proceeds to allow the entire surface of the wafer W to be completely in contact with the mounting surface (FIG. 4). Moreover, in the repetition of the halt of the ascent operation of the susceptor 12, respective predetermined times for which the ascent operation of the susceptor 12 is halted are set equal to each other, for example, to 0.5 second.

According to this embodiment, after the edge of the wafer W is brought into contact with the mounting surface, the ascent operation of the susceptor 12 is halted for the predetermined time. Thereafter, the ascent operation of the susceptor 12 is resumed. That is to say, when the ascent operation of the susceptor 12 is halted, the wafer W continuously remains stationary for the predetermined time. For this reason, the vibration of the wafer W generated by the drag force N caused by the contact between the wafer W and the mounting surface can be attenuated by the damping effect of the wafer W, thereby extinguishing the drag force N. Furthermore, the halt of the ascent operation of the susceptor 12 and the resumption of the ascent operation of the susceptor 12 are repeated while the contact between the wafer W and the mounting surface progresses. Thus, whenever the drag force N is generated with the progress of the contact between the wafer W and the mounting surface, the vibration of the wafer W generated by the drag force N is attenuated, which makes it possible to extinguish the drag force N. Accordingly, it is possible to prevent the drag force N from being exerted on the wafer W as a moving force in the horizontal direction. As a result, when the wafer W is mounted on the susceptor 12, it is possible to suppress the misalignment of the wafer W from a predetermined position on the mounting surface.

In this embodiment, after the edge of the wafer W is brought into contact with the mounting surface or while the contact between the wafer W and the mounting surface progresses, the ascent operation of the susceptor 12 is halted for the predetermined time. Thus, an operation in which the wafer W and the mounting surface approach each other is halted for the predetermined time, thereby sufficiently diffusing gases from a gap between the wafer W and the mounting surface. As a result, it is possible to prevent the gases from remaining in the gap between the wafer W and the mounting surface. It is therefore possible to prevent the wafer W from floating from the mounting surface and being misaligned even when the chamber 11 is under a depressurized environment.

Figure 5A:
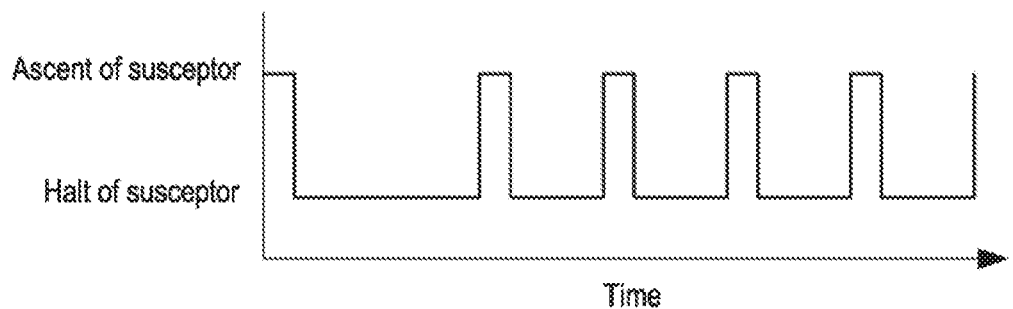
FIGS. 5A and 5B are sequence diagrams of modifications of the substrate mounting method of FIGS. 3A to 3E, FIG. 5A showing a first modification and FIG. 5B showing a second modification.
Figure 5B:
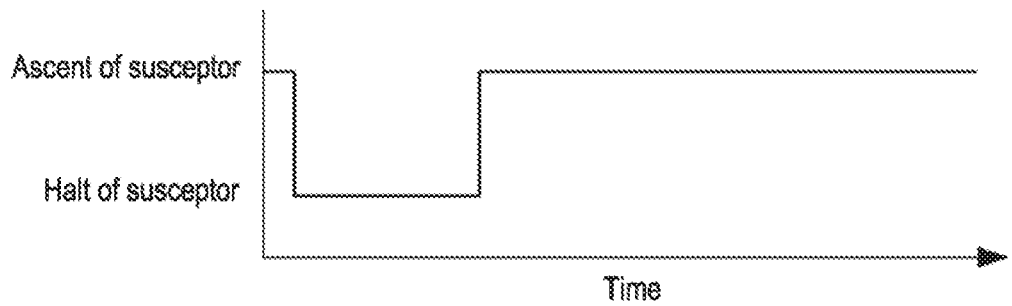

In the above embodiment, in the repetition of the halt of the ascent operation of the susceptor 12, the predetermined times for which the ascent operation of the susceptor 12 is halted are set equal to each other. It is considered that an initial drag force N generated when the wafer W is initially brought into contact with the mounting surface is greater than that resulting from the subsequent progress of the contact between the wafer W and the mounting surface. In view of the foregoing, a time during which the ascent operation of the susceptor 12 is halted when the wafer W and the mounting surface is initially brought into contact with each other may be set to be longer than a time during which the ascent operation of the susceptor 12 is subsequently halted (FIG. 5A). Accordingly, it is possible to firmly attenuate the large vibration of the wafer W, which is generated by the large drag force N caused when the wafer W and the mounting surface are initially brought into contact with each other. Further, it is considered that, after the wafer W and the mounting surface are initially brought into contact with each other, a drag force N caused by the subsequent progress of the contact between the wafer W and the mounting surface is very small. In view of the foregoing, the ascent operation of the susceptor 12 may be halted for a predetermined time only when the wafer W and the mounting surface are initially brought into contact with each other (FIG. 5B). Accordingly, it is possible to shorten a time required for mounting the wafer W on the susceptor 12, thereby improving the throughput.

Further, in the above embodiment, the ascent operation of the susceptor 12 is halted immediately after the edge of the wafer W is brought into contact with the mounting surface. However, there may be a case where the edge of the wafer W is brought into contact with the mounting surface earlier than expected due to thermal expansion of the wafer W or the susceptor 12. Thus, the halt of the ascent operation of the susceptor 12 for a predetermined time and the resumption of the ascent operation of the susceptor 12 may be repeated before the edge of the wafer W is brought into contact with the mounting surface.

Next, a substrate mounting device and a substrate mounting method according to a second embodiment of the present disclosure will be described.

The configuration and the operation of this embodiment are basically the same as those of the aforementioned first embodiment, and therefore, the description of the configuration and the operation that overlap with the first embodiment will be omitted, and the differences in configuration and operation will be described.

Figure 6A:
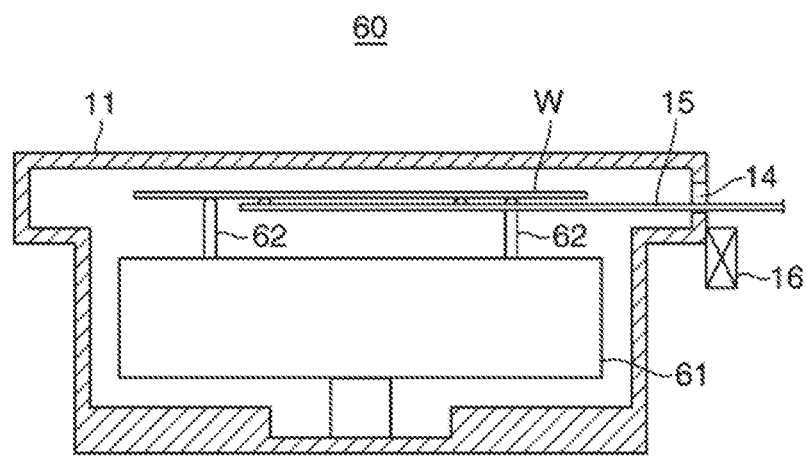
FIGS. 6A and 6B are sectional views schematically showing a configuration of a substrate processing apparatus which incorporates a substrate mounting device according to a second embodiment of the present disclosure, FIG. 6A showing a state where a wafer is delivered to lift pins and FIG. 6B showing a state where the wafer is mounted on a susceptor.
Figure 6B:
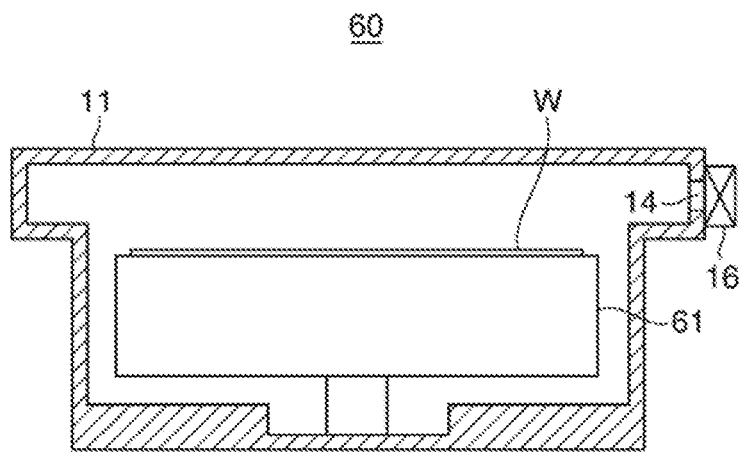

FIGS. 6A and 6B are sectional views schematically showing a configuration of a substrate processing apparatus which incorporates a substrate mounting device according to this embodiment. FIG. 6A shows a state where a wafer is delivered to lift pins and FIG. 6B shows a state where the wafer is mounted on a susceptor.

In FIGS. 6A and 6B, a substrate processing apparatus 60 includes a table-shaped susceptor (mounting table) 61 disposed at a lower portion inside a chamber 11, and a plurality of (e.g., three) lift pins (projections) 62 (only two lift pins are shown) formed to protrude upwardly from a mounting surface of the susceptor 61. A combination of the susceptor 61 and the respective lift pins 62 constitutes the substrate mounting device according to this embodiment. The height of a tip of each of the lift pins 62 when it protrudes is almost equal to the height of a gate 14. Thus, a wafer W held by a transfer arm 15 is located in the vicinity of the tip of each of the lift pins 62 and at an upper portion inside the chamber 11. The wafer W is delivered to the respective lift pins 62 by slightly descending the transfer arm 15 or slightly ascending the lift pins 62.

The susceptor 61 is configured so as not to move in the vertical direction, whereas the respective lift pins 62 are configured to be moved in the vertical direction by an elevation mechanism incorporated in the susceptor 61. The respective lift pins 62 are moved (descend) downward while supporting the wafer W so that the wafer W thus supported is brought close to the mounting surface of the susceptor 61. Thus, the wafer W is mounted on the mounting surface as it is.

Figure 7A:
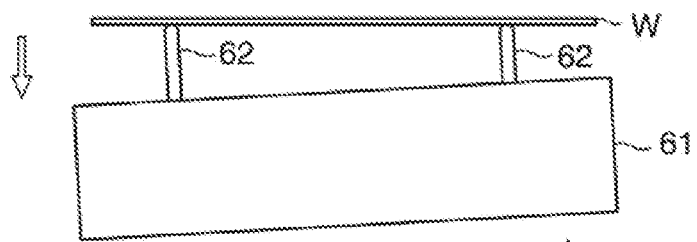
FIGS. 7A to 7E are process views showing a substrate mounting method according to the present embodiment.
Figure 7B:
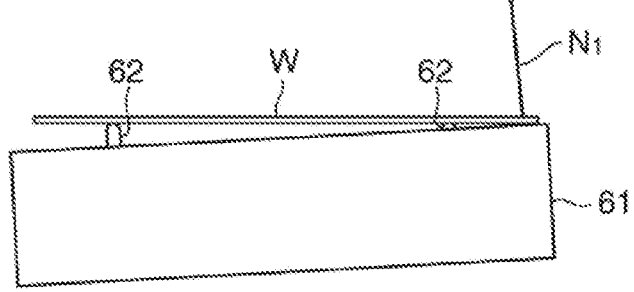
Figure 7C:
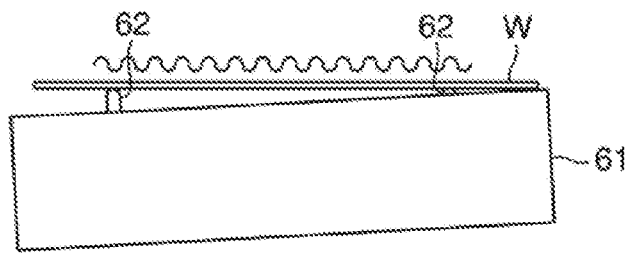
Figure 7D:
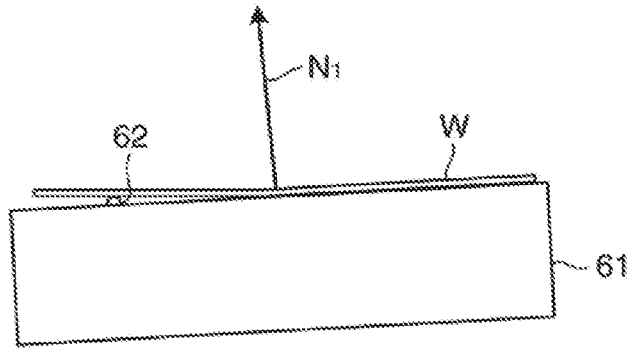
Figure 7E:
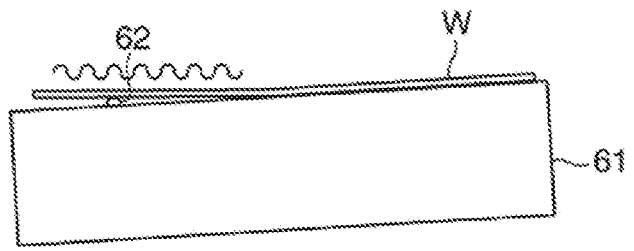
Figure 8:
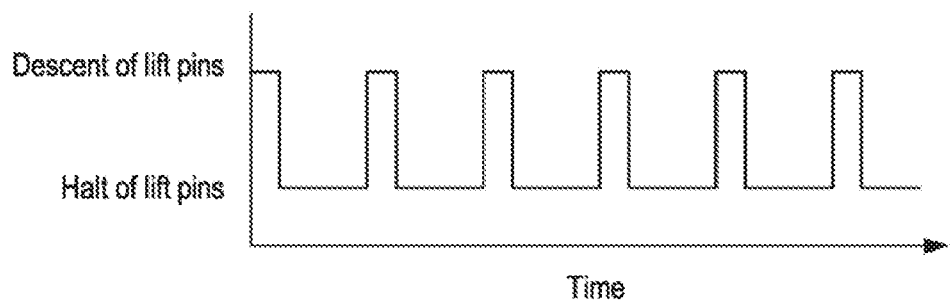
FIG. 8 is a sequence diagram of the substrate mounting method of FIGS. 7A to 7E.

FIGS. 7A to 7E are process views showing a substrate mounting method according to the present embodiment, and FIG. 8 is a sequence diagram of the substrate mounting method of FIGS. 7A to 7E.

First, the wafer W is delivered to the respective lift pins 62 and the respective lift pins 62 supports the wafer W. Subsequently, the lift pins 62 descend until the edge of the wafer W thus supported comes into contact with the mounting surface (FIG. 7A).

Subsequently, when the edge of the wafer W is brought into contact with the mounting surface, a drag force $N_1$ generated from the mounting surface is exerted on the wafer W (FIG. 7B). The drag force $N_1$ is converted into the vibration of the wafer W (FIG. 7C). Once the edge of the wafer W is brought into contact with the mounting surface, the descent operation of the respective lift pins 62 is halted to allow the wafer to be in a stationary state. The halt of the descent operation continues for a predetermined time. That is to say, even in this embodiment, since the wafer continuously remains stationary for the predetermined time, the drag force N caused by the contact between the edge of the wafer W and the mounting surface is converted into the vibration of the wafer W. Subsequently, the vibration is attenuated and ultimately extinguished by a damping effect of the wafer W.

Subsequently, after the halt of the descent operation of the respective lift pins 62 continues for the predetermined time, the descent operation of the respective lift pins 62 is resumed. When the respective lift pins 62 descend by a certain level, the descent operation is halted again for the predetermined time. At this time, the drag force $N_1$ is exerted on the wafer W as the contact between the wafer W and the mounting surface progresses (FIG. 7D). The drag force $N_1$ exerted on the wafer W is converted into the vibration of the wafer W (FIG. 7E). Even in this situation, since the wafer W continuously remains stationary for the predetermined time, the vibration of the wafer W into which the drag force $N_1$ has been converted is attenuated by the damping effect of the wafer W. Therefore, even in this embodiment, the drag force $N_1$ caused by the progress of the contact between the wafer W and the mounting surface is converted into the vibration of the wafer W. and subsequently, attenuated and extinguished.

Thereafter, the halt of the descent operation of the respective lift pins 62 for the predetermined time and the resumption of the descent operation of the respective lift pins 62 are repeated until the contact between the wafer W and the mounting surface progresses to allow the entire surface of the wafer W to be completely in contact with the mounting surface (FIG. 8). Moreover, in the repetition of the halt of the descent operation of the respective lift pins 62, the predetermined times during which the respective lift pins 62 are halted are set equal to each other as in the first embodiment.

According to this embodiment, after the edge of the wafer W is brought into contact with the mounting surface, the descent operation of the respective lift pins 62 is halted and the wafer W continuously remains stationary for the predetermined time. Thus, the vibration of the wafer W generated by the drag force $N_1$ is attenuated, which makes it possible to extinguish the drag force $N_1$. Furthermore, the halt of the descent operation of the respective lift pins 62 and the resumption of the descent operation of the respective lift pins 62 are repeated while the contact between the wafer W and the mounting surface progresses. Thus, whenever the drag force $N_1$ is generated by the progress of the contact between the wafer W and the mounting surface, the vibration of the wafer W generated by the drag force $N_1$ is attenuated, thereby extinguishing the drag force $N_1$. Accordingly, it is possible to prevent the drag force $N_1$ from being exerted on the wafer W as a moving force in the horizontal direction.

In this embodiment, the descent operation of the respective lift pins 62 is halted for the predetermined time after the edge of the wafer W is brought into contact with the mounting surface or while the contact between the wafer W and the mounting surface progresses. It is therefore possible to prevent gases from remaining between the wafer W and the mounting surface.

Figure 9A:
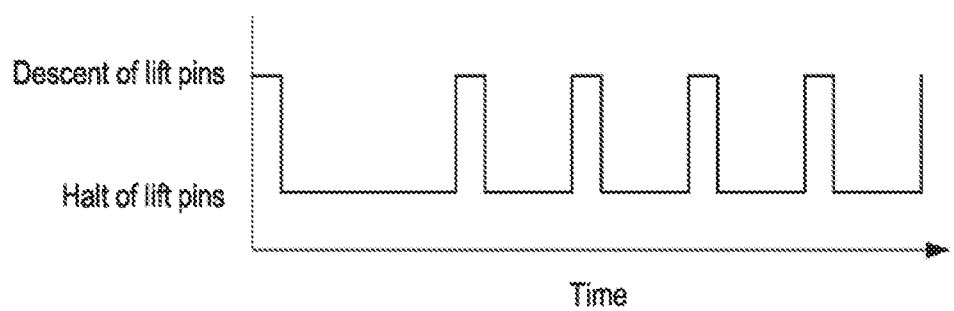
FIGS. 9A and 9B are sequence diagrams of modifications of the substrate mounting method of FIGS. 7A to 7E, FIG. 9A showing a first modification and FIG. 9B showing a second modification.
Figure 9B:
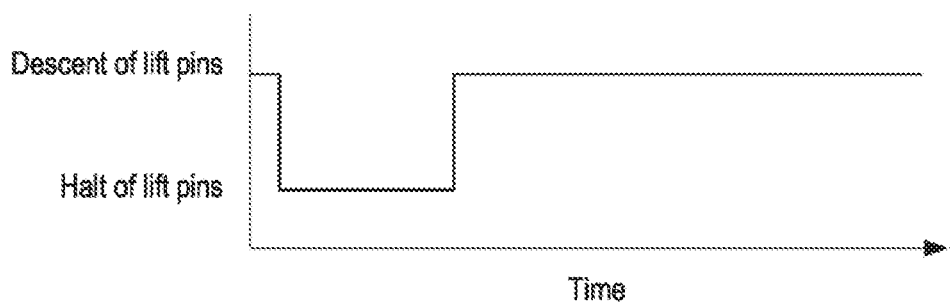

In the above embodiment, in the repetition of the halt of the descent operation of the respective lift pins 62, the predetermined times during which the respective lift pins 62 are halted has been described to set equal to each other. However, when the wafer W and the mounting surface are initially brought into contact with each other, an initial halt time during which the descent operation of the respective lift pins 62 is halted may be set to be longer than a subsequent halt time during which the descent operation of the respective lift pins 62 is subsequently halted (FIG. 9A). Alternatively, the descent operation of the respective lift pins 62 may be halted for the predetermined time only when the wafer W and the mounting surface are initially brought into contact with each other (FIG. 9B). In some embodiments, the halt of the descent operation of the respective lift pins 62 for the predetermined time and the resumption of the descent operation of the respective lift pins 62 may be repeated before the wafer W and the mounting surface are brought into contact with each other.

The present disclosure has been described above in connection with the respective embodiments but is not limited to the respective embodiments.

As an example, although the wafer W has been described to be mounted on the susceptor 12 (or 61) in the respective embodiments, the substrate mounting method according to the respective embodiments can be applied in mounting a plate-shaped object on a table-shaped object irrespective of the type of such a plate-shaped object. Particularly, in a case where the plate-shaped object is an FPD (flat panel display), the FPD is much larger than the wafer and thus, there is a high possibility that the FPD is locally located on the table-shaped object, which causes a positional misalignment. Therefore, a positional misalignment suppress benefit obtained by applying the substrate mounting method according to the respective embodiments described above to the FPD is much larger than that obtained when the substrate mounting method according to the respective embodiments described above is applied to the wafer.

In addition, although in the above embodiments, the interior of the chamber 11 has been described to be depressurized, the interior of the chamber 11 may not be depressurized. Even in this case, it is possible to suppress the wafer W from being misaligned in the horizontal direction by applying the substrate mounting method according to the above embodiments.

The present disclosure may be achieved by supplying a control part (not shown) of the substrate processing apparatus 10 (or 60) with a storage medium on which program codes of software for implementing the functions of the respective embodiments described above are recorded and by causing a CPU of the control part to read out and execute the program codes stored in the storage medium.

In such a case, the program code itself which read from the memory medium implements the respective functions of the above embodiments, and the program code and the memory medium that stores the program code constitute the present disclosure.

In addition, examples of the storage medium for providing the program code may include RAM, NV-RAM, a floppy (registered mark) disk, a hard disk, an optomagnetic disk, an optical disk such as CD-ROM, CD-R, CD-RW and DVD (DVD-ROM, DVD-RAM, DVD-RW, DVD+RW), a magnetic tape, a nonvolatile memory card, and other ROMs, which are capable of storing the program code. Alternatively, the program code may be provided to the control part by downloading from another computer and data base (both not shown) which are connected to an internet, a commercial network, a local area network or the like.

Further, the respective functions of the above embodiments may be implemented by executing the program code which is read by the CPU, and by allowing an OS (operating system) running on the CPU to execute some or all of the actual processes based on an instruction of the program code.

Further, the respective functions of the above embodiments may be implemented by writing the program code read from the storage medium into a memory provided in a function expansion board or a function expansion unit connected to the control part, and by allowing a CPU or the like provided in the function expansion board or the function expansion unit to execute a portion or all of the actual processes based on an instruction of the program code.

The program code may be configured in a form such as an object code, a program code executed by an interpreter, a script data provided to the OS, or the like.

According to the present disclosure, after at least a portion of a substrate is brought into contact with a mounting surface of a mounting table, an operation in which the substrate approaches the mounting table is halted. After the operation in which the substrate approaches the mounting table is halted, the operation is resumed. Thus, the substrate first remains stationary. The vibration of the substrate, which is generated by a drag force caused by the contact between the substrate and the mounting surface, can be attenuated by a damping effect of the substrate. Accordingly, it is possible to extinguish the drag force and to prevent the drag force from being exerted on the substrate as a moving force of the substrate. As a result, it is possible to suppress the misalignment of the substrate when the substrate is mounted on the mounting table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate mounting method of bringing a substrate close to a mounting table to mount the substrate on the mounting table by reducing a protrusion amount of a plurality of projections configured to protrude from a substrate-mounting surface of the mounting table and to support the substrate, the protrusion amount being defined to protrude from the substrate-mounting surface, the method comprising:

after at least a portion of the substrate is brought into contact with the substrate-mounting surface, halting an operation of bringing the substrate close to the mounting table; and after the step of halting the operation of bringing the substrate close to the mounting table, resuming the operation of bringing the substrate close to the mounting table.

2. The substrate mounting method of claim 1, further comprising: repeating the step of halting the operation of bringing the substrate close to the mounting table and the step of resuming the operation of bringing the substrate close to the mounting table.

3. The substrate mounting method of claim 2, wherein an initial halt time during which the operation of bringing the substrate close to the mounting table is initially halted is longer than a subsequent halt time during which the operation of bringing the substrate close to the mounting table is subsequently halted.

4. The substrate mounting method of claim 1, wherein the operation of bringing the substrate close to the mounting table is performed by ascending the mounting table toward the substrate supported by the plurality of projections.

5. The substrate mounting method of claim 1, wherein the operation of bringing the substrate close to the mounting table is performed by descending the plurality of projections toward the mounting table.

6. The substrate mounting method of claim 1, wherein the operation of bringing a substrate close to a mounting table to mount the substrate on the mounting table is performed under a depressurized environment.

7. A substrate mounting device comprising:
a mounting table; and
a plurality of projections configured to protrude from a substrate-mounting surface of the mounting table and to support a substrate,
wherein the substrate is mounted on the mounting table by ascending the mounting table toward the substrate supported by the plurality of projections,
wherein an operation of ascending the mounting table is halted after at least a portion of the substrate is brought into contact with the substrate-mounting surface, and the operation of ascending the mounting table is resumed after the operation of ascending the mounting table is halted.

8. A substrate mounting device comprising:
a mounting table; and
a plurality of projections configured to protrude from a substrate-mounting surface of the mounting table and to support a substrate,
wherein the substrate is mounted on the mounting table by descending the plurality of projections toward the mounting table,
wherein an operation of descending the plurality of projections is halted after at least a portion of the substrate is brought into contact with the substrate-mounting surface, and the operation of descending the plurality of projections is resumed after the operation of descending the plurality of projections is halted.

* * * * *